(12) United States Patent
Ito et al.

(10) Patent No.: US 6,549,002 B2
(45) Date of Patent: Apr. 15, 2003

(54) PULSE SIGNAL GENERATOR HAVING INTEGRALLY MADE DETECTING ASSEMBLY AND WAVEFORM SHAPING CIRCUIT

(75) Inventors: Tomoaki Ito, Tokyo (JP); Masami Tanaka, Tokyo (JP); Tadashi Kubota, Tokyo (JP); Yasuhiro Masuzaki, Tokyo (JP)

(73) Assignee: Hirose electric Co., Ltd., Tokyo (JP)

( * ) Notice: Subject to any disclaimer, the term of this patent is extended or adjusted under 35 U.S.C. 154(b) by 0 days.

(21) Appl. No.: 09/981,710

(22) Filed: Oct. 19, 2001

(65) Prior Publication Data

US 2002/0024371 A1 Feb. 28, 2002

(51) Int. Cl.$^7$ .............................. G01B 7/30; H03K 3/00; G01P 3/481; G01D 5/245
(52) U.S. Cl. ............. 324/207.13; 324/174; 324/207.15; 324/207.25; 307/106
(58) Field of Search ................................ 324/173, 174, 324/207.13, 207.15, 207.22, 207.25, 209; 123/406.58, 617; 73/514.39; 307/106, 116–118; 310/155, 168, 68 B; 361/179, 180; 327/510

(56) References Cited

U.S. PATENT DOCUMENTS

| 4,757,720 A | | 7/1988 | Akira |
| 4,853,632 A | * | 8/1989 | Nagano et al. |
| 5,181,020 A | * | 1/1993 | Furukawa et al. |
| 6,046,584 A | * | 4/2000 | Nakane et al. ......... 324/207.22 |
| 6,259,248 B1 | * | 7/2001 | Gotoh et al. ......... 324/207.13 X |

FOREIGN PATENT DOCUMENTS

| EP | 0856809 A | 8/1998 |
| JP | 04229389 | 8/1992 |

* cited by examiner

Primary Examiner—Gerard R. Strecker
(74) Attorney, Agent, or Firm—Kanesaka & Takeuchi

(57) ABSTRACT

A pulse signal generator comprises a detecting assembly including a magnetic element wire (5) and a coil (2) wound around a bobbin (6) to generate electric pulses and a waveform shaping circuit integrated with the detecting assembly so as to shape the waveform of the electric pulses to output a pulse signal.

5 Claims, 5 Drawing Sheets

1

PULSE SIGNAL GENERATOR HAVING INTEGRALLY MADE DETECTING ASSEMBLY AND WAVEFORM SHAPING CIRCUIT

BACKGROUND OF THE INVENTION

1. Field of the Invention

The present invention relates to pulse signal generators.

2. Description of the Related Art

In the fields of automatic controls, and electrical and electronics equipment, a pulse signal responsive to the position or speed of a moving object or a variety of operations has been used.

An example of the pulse signal generators of this type is a rotation detector that employs an electromagnetic, light pick-up, Hall or magnetic reluctance element. The electromagnetic type, however, suffers from a low output at low speed rotations. The light pick-up type requires a broadband d-c amplifier and a dust-proof structure. The Hall or magnetic reluctance type requires a plurality of elements and an amplifier. The elements of the light pick-up/Hall/magnetic reluctance type are too sensitive to temperatures to be used in the atmosphere that can have a large temperature change.

Consequently, where the rotation detector is used to detect the rotary speed or position of a crank or cam shaft of a car, it is impossible to detect very low to high speed rotations. In addition, it is necessary to provide an interface circuit for an engine control module. Moreover, the rotation detector is not suitable for use in automobiles where it can be exposed to temperature changes or noise. Furthermore, it is difficult for the rotation detector to make a stop/move decision (whether the car is at rest or in motion) when the power is on.

Japanese patent application Kokai Nos. 2000-101400 and 2000-101401 disclose pulse signal generators that employ a magnetic element wire for producing a large Barkhausen jump to detect very low to high speed rotations. These pulse signal generators are able to resolve the above problems but need improvements for use in automobiles. That is, they must be easy to assemble or connect to equipment that uses the generated pulse signal or high in the S/N ratio or load capacity according to applications.

SUMMARY OF THE INVENTION

Accordingly, it is an object of the invention to provide a pulse generator capable of resolving the above problems and being suitable for practical applications.

According to the invention there is provided a pulse signal generator which comprises a detecting assembly using a magnetic element wire capable of producing a large Barkhausen jump to generate a series of electric pulses; and a waveform shaping circuit integrated with the detecting assembly so as to shape a waveform of the electric pulses to output a pulse signal.

According to embodiments of the invention, the waveform shaping circuit has a pair of threshold values. The detecting assembly further comprises a wire bobbin surrounding the magnetic element wire, a coil wound around the wire bobbin, and a pair of output terminals connected to both ends of the coil, the magnetic element wire, the coil, and the output terminals being integrated with the bobbin as a unit. The waveform shaping circuit is mounted on a waveform shaping circuit board, which has a pair of input terminals for connection to the output terminals of the coil. The output terminals extend toward the waveform shaping circuit board for direct connection with the waveform shaping circuit. The detecting assembly and the waveform shaping circuit are embedded in the outer case.

DESCRIPTION OF THE PREFERRED EMBODIMENT

Figure 1:
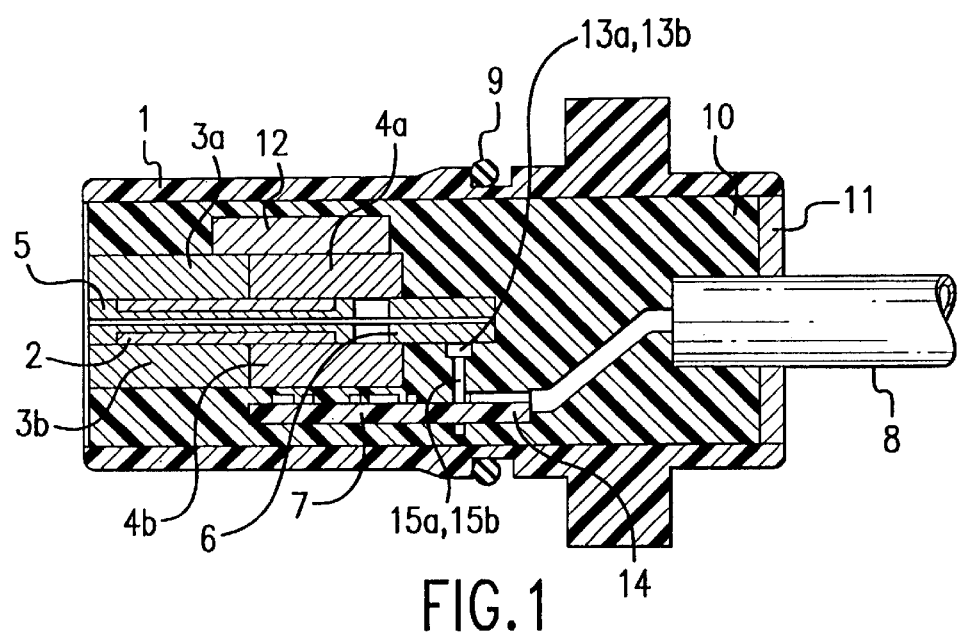
FIG. 1 is a sectional view of a pulse signal generator according to an embodiment of the invention.

In FIG. 1, a pulse signal generator comprises an outer case 1 made of a plastic material, a detecting assembly consisting of a magnetic wire 5 capable of producing a large Barkhausen jump and a coil 2 responsive to the object to be detected to generate a sequence of electric pulses, and a waveform shaping circuit board 7 for shaping a waveform of the electric pulses to generate a signal pulse. The detecting assembly and the waveform shaping circuit board are embedded in the outer case 1. The detecting assembly is the same as those of JP 2000-101400 and 2000-101401 in principle but different in structure. That is, it comprises a magnetic element wire 5, a wire bobbin 6 for surrounding the magnetic element wire 5, a coil 2 wound around the bobbin 6, a pair of magnets 3a and 3b and yokes 4a and 4b provided on opposite side of the magnetic element wire 5 and the coil 2, and an adjusting yoke 12 provided on the side of the magnet 3a and the yoke 4a. A pair of output terminals 13a and 13b are provided at the rear end of the wire bobbin 6 to connect the coil 2 and the waveform shaping circuit. The magnetic element wire 5, the coil 2, and the output terminals 13a and 13b to the waveform shaping circuit are integrated with the wire bobbin 6 as a unit so that assembling the wire bobbin 6, the magnets 3a and 3b, and yokes 4a and 4b is made easy.

The waveform shaping circuit is provided on a waveform shaping circuit board 7 that comprises input terminals 15a and 15b and an output terminal 14 to be connected to a cable 8 of the equipment that uses the generated pulse signal. A filler 10 is filled in the outer case 1 to fix the detecting assembly, the waveform shaping circuit board 7, and the termination of the cable 8. A sealing agent 11 is applied to the outlet of the outer case 1. An O-ring 9 is provided around the outer case 1 to keep airtight the joint between the pulse signal generator 20 and the equipment.

Figure 2:
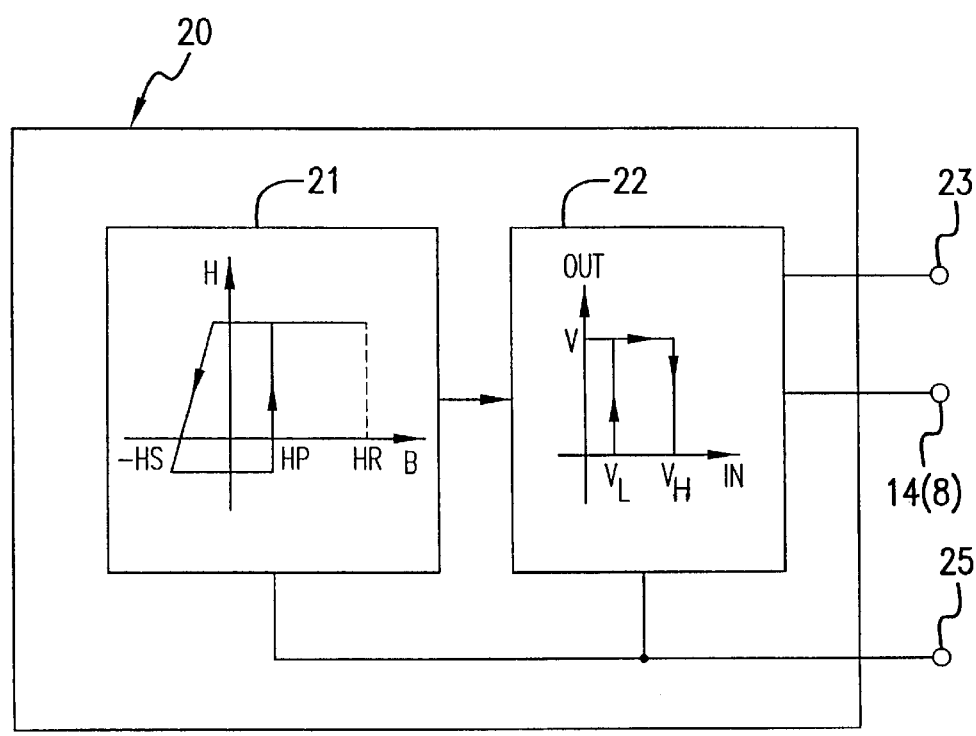
FIG. 2 is an electrically equivalent schematic diagram of the pulse signal generator.

In FIG. 2, the pulse signal generator 20 comprises a magnetic circuit module 21 including the detecting assembly with the magnetic element wire 5 having a B-H characteristic for producing a large Barkhausen jump responsive to the object to be detected and a waveform shaping circuit module 22 including the waveform shaping circuit board 7 for shaping the waveform of an electric pulse generated by the magnetic circuit module 21. Also, there are provided a power terminal 23 and a ground terminal 25.

Figure 3:
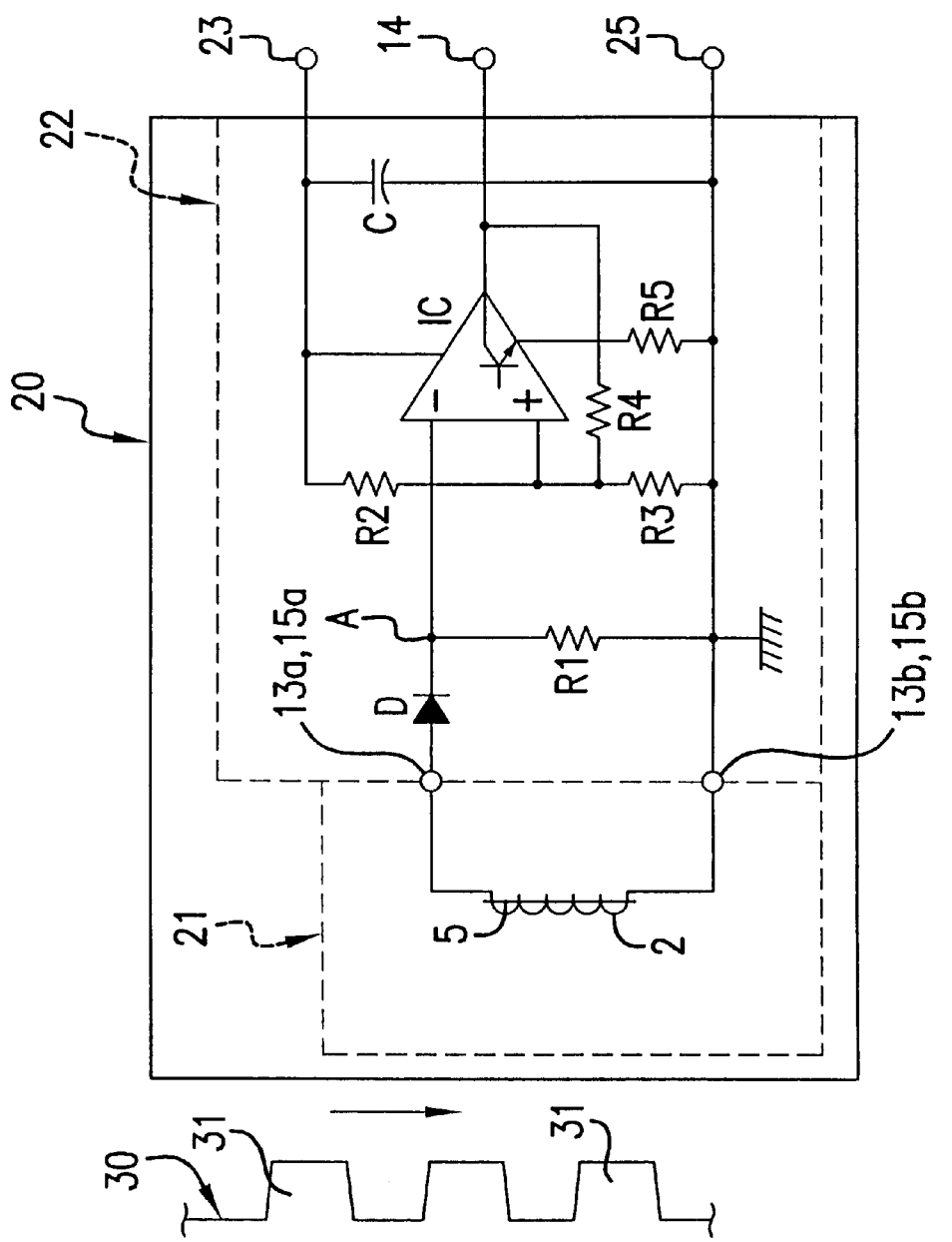
FIG. 3 is an electrical circuit diagram of the pulse signal generator.

In FIG. 3, the output terminals 13a and 13b of the magnetic circuit module 21 are connected to the input terminal 15a and 15b of the waveform shaping circuit module 22, respectively. The waveform shaping circuit 22 comprises a diode D, resistors R1–R5, a capacitor C, and a comparator IC connected as shown. This waveform shaping circuit 22, which has two thresholds, is well known and, therefore, its detailed description will be omitted.

Figure 4:
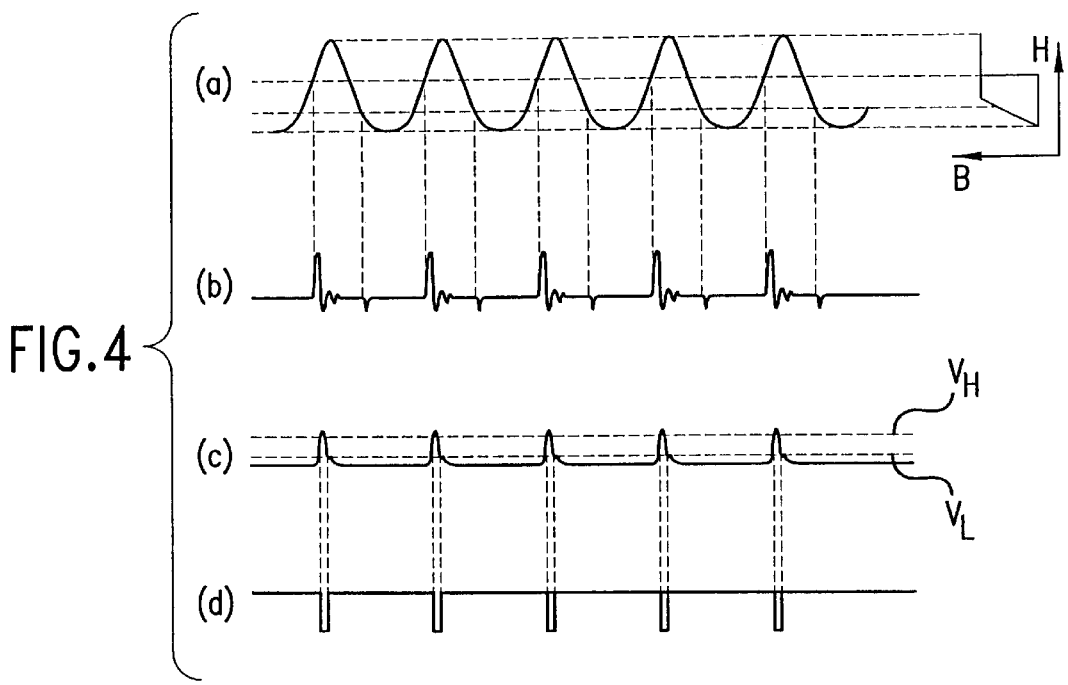
FIG. 4 is a graph showing magnetic field and voltage changes at various joints of the pulse signal generator.

In FIG. 3, the object to be detected or toothed wheel 30 rotates in step with the rotation of an automobile engine, for example, adjacent to the magnets 3a and 3b and the magnetic element wire 5 of the pulse signal generator 20. Every time a tooth 31 of the toothed wheel 30 passes in the vicinity of the magnets 3a and 3b and the magnetic element wire 5, the magnetic field applied to the magnetic element wire 5 changes as shown in FIG. 4(a). In response to such magnetic changes, the magnetic element wire 5 produces a large Barkhausen jump, generating a series of electric pulses as shown in FIG. 4(b). These electric pulses are rectified by the diode D to become such electric pulses as shown in FIG. 4(c) at the joint A of the waveform shaping circuit. The rectified pulses are shaped by the waveform shaping circuit, which has two thresholds VH and VL, and output at the output terminal 14 as such a pulse signal as shown in FIG. 4(d).

Figure 5:
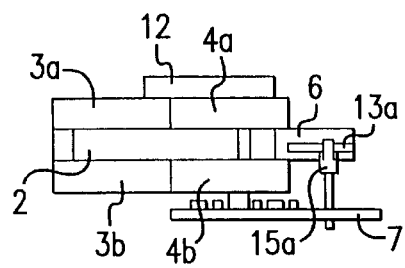
FIG. 5 is a front view of a detecting assembly for the pulse signal generator.
Figure 6:
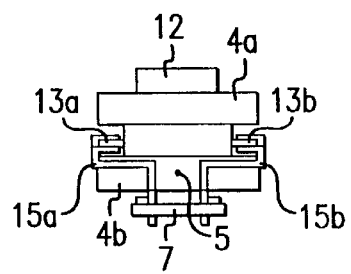
FIG. 6 is a right-hand side view of the detecting assembly.

In FIGS. 5 and 6, the waveform shaping circuit board 7 is attached to the detecting assembly so that a portion thereof overlaps the lower yoke 4b. The input terminals 15a and 15b extend upwardly and outwardly from the waveform shaping circuit board 7 and terminate with upper and lower fingers, between which the output terminals 13a and 13b are held for electrical and mechanical connection.

Figure 7:
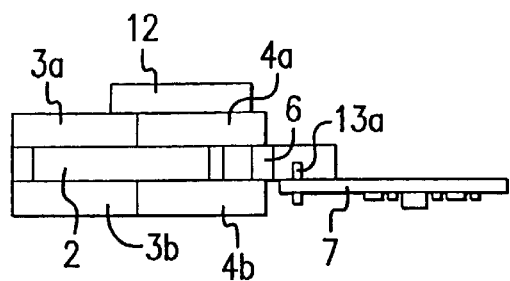
FIG. 7 is a front view of a detecting assembly according to another embodiment of the invention.
Figure 8:
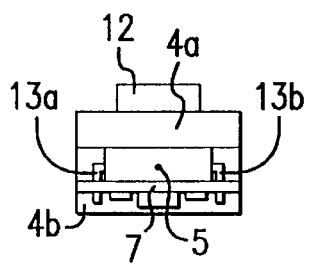
FIG. 8 is a right-hand side view of the detecting assembly of FIG. 7.

In FIGS. 7 and 8, the waveform shaping circuit board 7 is attached to the detecting assembly so that a portion thereof overlaps the lower face of the rear portion of the wire bobbin 6. The output terminals 13a and 13b extends downwardly from opposite sides of the rear portion of the wire bobbin 6 for connection to the waveform shaping circuit board 7.

Figure 9:
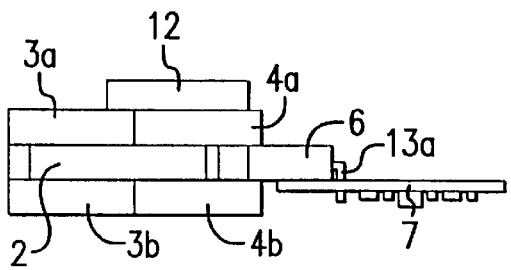
FIG. 9 is a front view of a detecting assembly according to still another embodiment of the invention.
Figure 10:
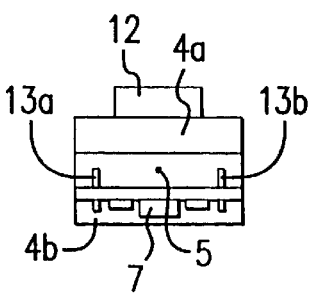
FIG. 10 is a right-hand side view of the detecting assembly of FIG. 9.

In FIGS. 9 and 10, the waveform shaping circuit board 7 is attached to the detecting assembly so that a portion thereof overlaps the lower face of the rear portion of the wire bobbin 6. The output terminals 13a and 13b extend downwardly from the rear end face of the wire bobbin 6 for connection to the waveform shaping circuit board 7.

FIG. 11(a) shows a train of pulses generated by the pulse signal generator in a period from power on to power off. FIG. 11(b) shows periods when the toothed wheel is stopped, moved, and stopped, respectively. FIG. 11(c) shows a train of pulses generated by the conventional sensor in a period from power on to power off in step of the rotation of the toothed wheel since a crest of the toothed wheel at rest faces the sensor. FIG. 11(d) shows a train of pulses generated by the conventional sensor in a period from power on to power off in step of the rotation of the toothed wheel since a valley of the toothed wheel at rest faces the sensor.

Figure 11:
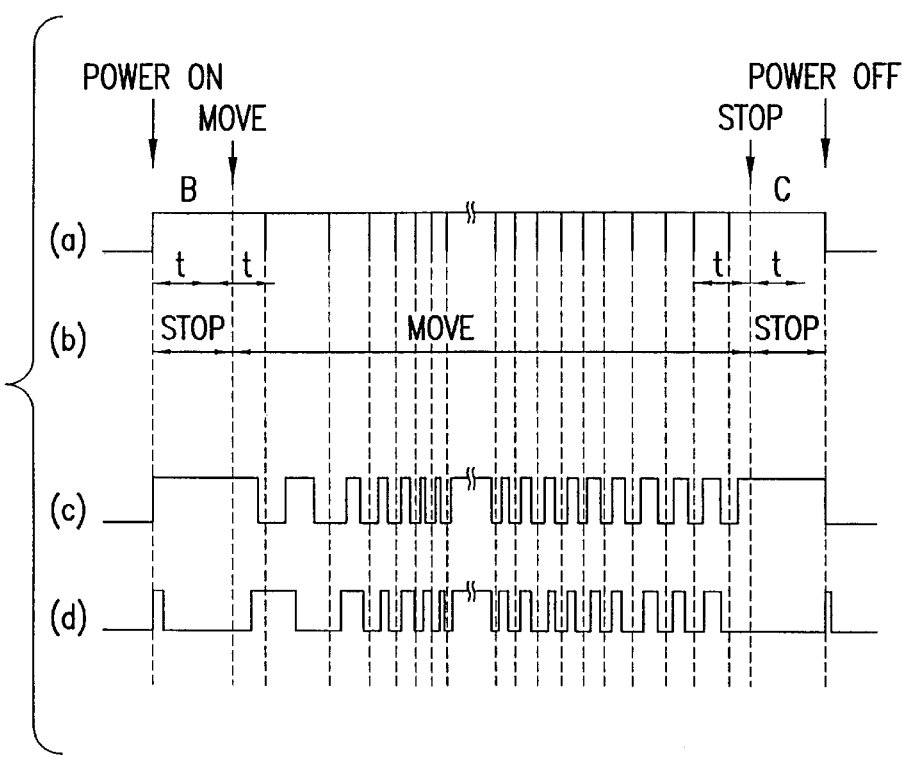
FIG. 11 is a graph showing trains of pulses generated in step of the motion of the object to be detected.

As apparent from FIG. 11, it is difficult for the conventional sensor to decide whether the toothed wheel is at rest or in motion because the output level of the sensor varies depending on whether a crest or a valley of the toothed wheel at rest faces the sensor. According to the invention, however, the output level of the pulse signal generator remains the same regardless of the position of the toothed wheel so that it is easy to make a stop/move decision of the toothed wheel. For example, in the period B in FIG. 11(a); that is, just after the power is on, the presence of a pulse within an interval of t sec. makes it possible to make such a decision that the toothed wheel starts to move. In the period C of FIG. 11(a), the absence of a pulse in an interval of t sec. indicates that the toothed wheel comes to rest.

Since the magnetic element wire, the coil, the output terminals to the waveform shaping circuit are provided on the wire bobbin to provide the waveform shaping circuit board as a unit, the assembly thereafter is made easy. The integration of the waveform shaping circuit improves the S/N ratio and load capacity and eliminates the need for an expensive shield cable and an interface circuit for connection to the engine control module, for example. According to the invention, it is possible to detect zero or very low to high speed rotations.

What is claimed is:

1. A pulse signal generator comprising:
    a detection assembly for detecting a movement of an object to be detected; and
    a waveform shaping circuit having two threshold values, said detecting assembly including:
        a magnetic element wire capable of producing a large Barkhausen jump in response to said movement of said object,
        a wire bobbin surrounding said magnetic wire,
        a coil wound around said wire bobbin and generating a series of electric pulses, and
        a pair of output terminals connected to both ends of said coil, wherein said magnetic element wire, said coil, and said output terminals are integrated with said wire bobbin as a unit, and said waveform shaping circuit shaping a waveform of said electric pulses to output a pulse signal and being integrated with said detecting assembly.

2. The pulse signal generator according to claim 1, which further comprises a waveform shaping circuit board on which said waveform shaping circuit is provided, said waveform shaping circuit board being integrated with said wire bobbin of said detecting assembly as a unit.

3. The pulse signal generator according to claim 2, wherein said waveform shaping circuit board has a pair of input terminals for connection to said output terminals of said detecting assembly.

4. The pulse signal generator according to claim 1, wherein said output terminals extend toward said waveform shaping circuit board for direct connection with said waveform shaping circuit.

5. The pulse signal generator according to 1, wherein said detecting assembly and said waveform shaping circuit are embodied in an outer case.

* * * * *